(12) United States Patent
Gao et al.

(10) Patent No.: US 8,287,944 B2
(45) Date of Patent: Oct. 16, 2012

(54) MAGNETIC MEMORY CELL CONSTRUCTION

(75) Inventors: Kaizhong Gao, Eden Prairie, MN (US); Haiwen Xi, Prior Lake, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/073,195

(22) Filed: Mar. 28, 2011

(65) Prior Publication Data

US 2011/0177621 A1  Jul. 21, 2011

Related U.S. Application Data (63) Continuation of application No. 12/233,764, filed on Sep. 19, 2008, now Pat. No. 7,935,435.

(60) Provisional application No. 61/087,207, filed on Aug. 8, 2008.

(51) Int. Cl.
*H01L 43/12* (2006.01)

(52) U.S. Cl. ............... 427/128; 360/324.2; 428/800

(58) Field of Classification Search ............ 360/324.2; 428/800, 810, 811, 811.1, 811.2, 815; 427/128, 427/129, 130, 131, 132
See application file for complete search history.

(56) References Cited

U.S. PATENT DOCUMENTS

| | | | |
|---|---|---|---|
| 6,226,160 B1 * | 5/2001 | Gallagher et al. | ......... 360/324.2 |
| 6,650,513 B2 | 11/2003 | Fullerton | |
| 6,714,444 B2 | 3/2004 | Huai | |
| 6,819,532 B2 | 11/2004 | Kamijo | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,952,364 B2 * | 10/2005 | Lee et al. | ............. 365/158 |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,161,829 B2 | 1/2007 | Huai | |
| 7,180,778 B2 | 2/2007 | Kawai | |
| 7,190,611 B2 | 3/2007 | Nguyen | |
| 7,201,977 B2 | 4/2007 | Li | |
| 7,230,845 B1 | 6/2007 | Wang | |
| 7,233,039 B2 | 6/2007 | Huai | |

(Continued)

OTHER PUBLICATIONS

Berger, Physic Rev. B 54, 9353 (1996).

(Continued)

*Primary Examiner* — Michael Cleveland
*Assistant Examiner* — Tabassom Tadayyon Eslami
(74) *Attorney, Agent, or Firm* — Mueting Raasch & Gebhardt PA (57) ABSTRACT

A magnetic tunnel junction cell having a free layer, a ferromagnetic pinned layer, and a barrier layer therebetween. The free layer has a central ferromagnetic portion and a stabilizing portion radially proximate the central ferromagnetic portion. The construction can be used for both in-plane magnetic memory cells where the magnetization orientation of the magnetic layer is in the stack film plane and out-of-plane magnetic memory cells where the magnetization orientation of the magnetic layer is out of the stack film plane, e.g., perpendicular to the stack plane.

14 Claims, 8 Drawing Sheets

U.S. PATENT DOCUMENTS

| | | |
|---|---|---|
| 7,241,631 B2 | 7/2007 | Huai |
| 7,241,632 B2 | 7/2007 | Yang |
| 7,242,045 B2 | 7/2007 | Nguyen |
| 7,242,048 B2 | 7/2007 | Huai |
| 7,245,462 B2 | 7/2007 | Huai |
| 7,313,013 B2 | 12/2007 | Sun |
| 7,369,427 B2 | 5/2008 | Diao |
| 7,394,248 B1 | 7/2008 | Guo |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,531,882 B2 | 5/2009 | Nguyen |
| 7,541,199 B2 * | 6/2009 | Bae et al. ............................ 438/3 |
| 7,576,956 B2 | 8/2009 | Huai |
| 7,630,177 B2 | 12/2009 | Beach |
| 7,768,749 B2 | 8/2010 | Beach |
| 7,935,435 B2 | 5/2011 | Gao |
| 7,939,188 B2 | 5/2011 | Xi |
| 8,043,732 B2 | 10/2011 | Anderson |
| 2005/0185455 A1 | 8/2005 | Huai |
| 2005/0201023 A1 | 9/2005 | Huai |
| 2006/0132990 A1 | 6/2006 | Morise |
| 2006/0187705 A1 | 8/2006 | Nakamura |
| 2007/0008661 A1 | 1/2007 | Min |
| 2007/0054450 A1 | 3/2007 | Hong |
| 2007/0063237 A1 | 3/2007 | Huai |
| 2007/0086121 A1 | 4/2007 | Nagase |
| 2007/0096229 A1 | 5/2007 | Yoshikawa |
| 2007/0120210 A1 | 5/2007 | Yuan |
| 2007/0171570 A1 * | 7/2007 | Gill .............................. 360/110 |
| 2007/0176251 A1 | 8/2007 | Oh |
| 2007/0188942 A1 * | 8/2007 | Beach et al. ................ 360/324.2 |
| 2007/0211393 A1 * | 9/2007 | Gill .......................... 360/324.12 |
| 2007/0228501 A1 | 10/2007 | Nakamura |
| 2007/0252186 A1 | 11/2007 | Yang |
| 2008/0062578 A1 | 3/2008 | Watanabe |
| 2008/0088980 A1 | 4/2008 | Kitagawa |
| 2008/0165453 A1 | 7/2008 | Kaiser |
| 2008/0230819 A1 | 9/2008 | Nguyen |
| 2008/0273380 A1 | 11/2008 | Diao |
| 2008/0310213 A1 | 12/2008 | Chen |
| 2008/0310219 A1 | 12/2008 | Chen |
| 2009/0050991 A1 | 2/2009 | Nagai |
| 2009/0237987 A1 | 9/2009 | Zhu |
| 2009/0302403 A1 | 12/2009 | Nguyen |
| 2011/0177621 A1 | 7/2011 | Gao |
| 2011/0180888 A1 | 7/2011 | Xi |

OTHER PUBLICATIONS

Diao et al., "Spin-transfer switching in MgO-based magnetic tunnel junctions" J. Appl. Phys. 99, 08G510 (2006).

Hosomi, H. Yamagishi, T. Yamamoto, K. Bessho, Y. Higo, K. Yamane, H. Yamada, M. Shoji, H. Hachino, C. Fukumoto, H. Nagao and H. Kano, "A Novel Nonvolatile Memory with Spin Torque Transfer Magnetization Switching: Spin-RAM," Electron Devices Meeting, IEDM Technical Digest, 2005, pp. 459-462, IEEE.

Jiang et al., "Temperature Dependence of Current-Induced Magnetization Switching in Spin Valves with a Ferromagnetic CoGd Free Layer" Phys. Rev. Lett. 97, 217202 (2006).

Li et al., "Effects of MgO tunnel barrier thickness on magnetohysteresis in perpendicularly magnetized magnetic tunnel junctions of GdFeCo/FeCo/MgO/FeCo/TbFe/Co" J. Appl. Phys. 99, 08T310 (2006).

Mangin, D. Ravelosona, J. A. Katine, J. J. Carey, B. D. Terris and E. E. Fullerton, "Current-induced magnetization reversal in nanopillars with perpendicular anisotropy," Nature Materials, 2006, pp. 210-215, vol. 5, Nature Publishing Group.

Meng et al., "Spin transfer in nanomagnetic devices with perpendicular anisotropy" J. Appl. Phys. 99, 08G519 (2006).

Miura, T. Kawahara, R. Takemura, J. Hayakawa, S. Ikeda, R. Sasaki, H. Takahashi, H. Matsuoka and H. Ohno, "A novel SPRAM (SPin-transfer torque RAM) with a synthetic ferrimagnetic free layer for higher immunity to read disturbance and reducing write-current dispersion," 2007 Symposium on VLSI, Technology Digest of Technical Papers, pp. 234-235.

Nakayama et al., "Spin transfer switching in TbCoFe/CoFeB/MgO/CoFeB/TbCoFe magnetic tunnel junctions with perpendicular magnetic anisotropy" J. Appl Phys. vol. 103, 07A710 ( 2008).

Nishimura et al., "Magnetic tunnel junction device with perpendicular magnetization films for high-density magnetic random access memory" J. Appl. Phys. 91, 5246 (2002).

Ohmori, H. et al., Perpendicular Magnetic Tunnel Junction with Tunneling Magnetoresistance Ratio of 64% Using MgO (100) Barrier Layer Prepared at Room Temperature, Journal of Applied Physics, 103, 07A911 (2008).

PCT Search Report and Written Opinion dated Jul. 21, 2010, Our Ref; 14962WO00.

PCT Search Report and Written Opinion dated Jun. 14, 2010, Our Ref: 14545WO00.

Sbbia, Rachid et al., Spin Transfer Switching Enhancement in Perpendicular Anisotropy Magnetic Tunnel Junctions with a Canted in-Plan Spin Polarizer, Journal of Applied Physics, American Institute of Physics, New York, U.S. LNKD-DOI:10.1063/1.3055373, vol. 105, No. 1., Jan. 6, 2009, pp. 13910, XP012119458.

Slonczewski, J.C. Current-driven excitation of magnetic multilayers. Journal of Magnetism and Magnetic Materials 159, L1-L7 (1996).

Sun, J.Z. Spin-current interaction with a monodomain magnetic body: A model study. Phys. Rev. B 62, 570 (2000).

U.S. Appl. No. 12/200,034 Xi et al., filed Aug. 28, 2009.

U.S. Patent Application No. 12/233/764 Gao et al., filed Sep. 19, 2008.

U.S. Appl. No. 12/269,537 Tang et al., filed Nov. 12, 2008.

U.S. Appl. No. 12/248,237, filed Oct. 9, 2008, Inventor: Zhu, (Ref. 14230).

U.S. Appl. No. 12/326,274, filed Dec. 2, 2008, Inventor: Dimitrov; Our Ref: 14783.00.

U.S. Appl. No. 12/398,214, filed Mar. 5, 2009, Inventor: Wang, (Ref. 14545).

Xi et al., "Perpendicular magnetization and exchange bias in epitaxial Cu/Ni/Fe50Mn50 thin films" Phys. Rev. B 72, 024447 (2005).

Xi, Haiwen and Robert M. White, Antiferromagnetic Thickness Dependence of Exchange Biasing, Physical Review B, vol. 61, No. 1, Jan. 1, 2000—1.

Haiwen Xi and Robert M. White, Antiferromagnetic Thickness Dependence of Exchange Biasing, Physical Review B, vol. 61, No. 1, Jan. 1, 2000—1.

* cited by examiner

MAGNETIC MEMORY CELL CONSTRUCTION

RELATED APPLICATIONS

This application is a continuation of U.S. application Ser. No. 12/233,764 filed Sep. 19, 2008 now U.S. Pat. No. 7,935,435 which claims priority to provisional patent application No. 61/087,207, filed on Aug. 8, 2008. The entire disclosure of application No. 61/087,207 is incorporated herein by reference.

BACKGROUND

Spin torque transfer technology, also referred to as spin electronics, combines semiconductor technology and magnetics, and is a more recent development. In spin electronics, the spin of an electron, rather than the charge, is used to indicate the presence of digital information. The digital information or data, represented as a "0" or "1", is storable in the alignment of magnetic moments within a magnetic element. The resistance of the magnetic element depends on the moment's alignment or orientation. The stored state is read from the element by detecting the component's resistive state.

The magnetic element, in general, includes a ferromagnetic pinned layer and a ferromagnetic free layer, each having a magnetization orientation that defines the resistance of the overall magnetic element. Such an element is generally referred to as a "spin tunneling junction," "magnetic tunnel junction", "magnetic tunnel junction cell", and the like. When the magnetization orientations of the free layer and pinned layer are parallel, the resistance of the element is low. When the magnetization orientations of the free layer and the pinned layer are antiparallel, the resistance of the element is high.

At least because of their small size, it is desirous to use magnetic tunnel junction elements in many applications. However, their small size also creates issues.

One of the primary issues preventing magnetic tunnel junction elements from replacing other memory elements is the memory cell-to-cell distribution. Significant variations from cell-to-cell exist for magnetic tunnel junction cells. In writing to those cells, the result is a switching field distribution, rather than a constant value; in reading back from those cells, there is variation in resistance and noise. Additionally, thermal stability and stray field sensitivity are issues. Various attempts have been made to provide more stabile, more consistent magnetic tunnel junction cells and memory arrays. There is always room for improvement.

BRIEF SUMMARY

The present disclosure relates to magnetic tunnel junction cells that have a free layer composed of a central ferromagnetic portion, having a readily switchable magnetization orientation, and a stabilizing portion, which stabilizes the magnetization configuration of the central ferromagnetic portion. If the stabilizing portion comprises an antiferromagnetic material, the stabilization is via exchange coupling at the interface between the central ferromagnetic portion and the stabilizing portion. If the stabilizing portion comprises a ferromagnetic portion, a spacer layer is present between the central ferromagnetic portion and the stabilizing portion, and the stabilization is via magnetostatic coupling across the spacer layer.

In one particular embodiment, this disclosure describes a magnetic tunnel junction cell having a free layer, a ferromagnetic pinned layer, and a barrier layer therebetween. The free layer has a central ferromagnetic portion and a stabilizing portion radially proximate the central ferromagnetic portion.

In another particular embodiment, this disclosure describes a method for making a magnetic tunnel junction cell. The method includes providing, in order, a bottom electrode, a ferromagnetic pinned layer, a barrier layer and a ferromagnetic free precursor layer. A free layer is formed from the precursor layer and a stabilizing material is deposited over the free layer. The stabilizing material is patterned to form a stabilizing ring radially proximate to the free layer. The free layer is exposed by removing at least a portion of the stabilization material. A top electrode is provided over the exposed free layer.

Additional embodiments of magnetic tunnel junction cells and memory units are disclosed, as well as memory arrays including the units, and methods of making and using the cells.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

This disclosure is directed to memory cells and methods of making those cells. The devices (e.g., magnetic tunnel junction cells) of this disclosure have a free layer that has a ferromagnetic center portion and an antiferromagnetic or a ferromagnetic portion radially around the center portion. In some embodiments, a spacer layer is positioned between the ferromagnetic center portion and the ferromagnetic portion. The antiferromagnetic portion stabilizes the magnetization orientation of the free layer. The construction can be used for both in-plane magnetic memory cells where the magnetization orientation of the magnetic layer is in the stack film plane and out-of-plane magnetic memory cells where the magnetization orientation of the magnetic layer is out of the stack film plane, e.g., perpendicular to the stack plane.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to magnetic tunnel junction cells and methods of making magnetic tunnel junction cells. The magnetic tunnel junction cells of this disclosure include a radially protective layer extending proximate at least the ferromagnetic free layer of the cell. While the present disclosure is not so limited, an appreciation of various aspects of the disclosure will be gained through a discussion of the examples provided below.

Figure 1A:
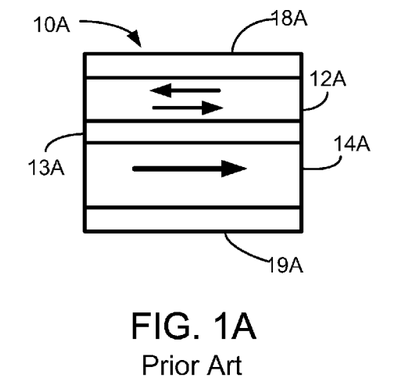
FIG. 1A is a side view cross-sectional diagram of an illustrative magnetic tunnel junction cell with in-plane magnetization orientation.

FIG. 1A is a cross-sectional schematic diagram of a generic magnetic tunnel junction cell 10A that includes a relatively soft ferromagnetic free layer 12A and a ferromagnetic reference (i.e., fixed or pinned) layer 14A. Ferromagnetic free layer 12A and ferromagnetic pinned layer 14A are separated by an oxide barrier layer 13A or non-magnetic tunnel barrier. Note that other layers, such as seed or capping layers, are not depicted for clarity.

Ferromagnetic layers 12A, 14A may be made of any useful ferromagnetic (FM) material such as, for example, Fe, Co or Ni and alloys thereof, such as NiFe and CoFe. Ternary alloys, such as CoFeB, may be particularly useful because of their lower moment and high polarization ratio, which are desirable for the spin-current switch. Either or both of free layer 12A and pinned layer 14A may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. The magnetization orientation of ferromagnetic free layer 12A is more readily switchable than the magnetization orientation of ferromagnetic pinned layer 14A; the two opposing magnetization arrows in free layer 12A represent readily switchable magnetization orientation. Barrier layer 13A may be made of an electrically insulating material such as, for example an oxide material (e.g., $Al_2O_3$, $TiO_x$ or MgO). Other suitable materials may also be used. Barrier layer 13A could optionally be patterned with free layer 12A or with pinned layer 14A, depending on process feasibility and device reliability.

The following are various specific examples of magnetic tunnel junction cells 10A. In some embodiments of magnetic tunnel junction cell 10A, oxide barrier layer 13A includes $Ta_2O_5$ (for example, at a thickness of about 0.5 to 1 nanometer) and ferromagnetic free layer 12A and a ferromagnetic pinned layer 14A include NiFe, CoFe, or Co. In other embodiments of magnetic tunnel junction cell 10, barrier layer 13A includes GaAs (for example, at a thickness of about 5 to 15 nanometers) and ferromagnetic free layer 12A and ferromagnetic pinned layer 14A include Fe. In yet other embodiments of magnetic tunnel junction cell 10A, barrier layer 13A includes $Al_2O_3$ (for example, a few nanometers thick) and ferromagnetic free layer 12A and ferromagnetic pinned layer 14A include NiFe, CoFe, or Co.

A first electrode 18A is in electrical contact with ferromagnetic free layer 12A and a second electrode 19A is in electrical contact with ferromagnetic pinned layer 14A. Electrodes 18A, 19A electrically connect ferromagnetic layers 12A, 14A to a control circuit providing read and write currents through layers 12A, 14A. The resistance across magnetic tunnel junction cell 10 is determined by the relative orientation of the magnetization vectors or magnetization orientations of ferromagnetic layers 12A, 14A. The magnetization direction of ferromagnetic pinned layer 14A is pinned in a predetermined direction while the magnetization direction of ferromagnetic free layer 12A is free to rotate under the influence of spin torque. Pinning of ferromagnetic pinned layer 14A may be achieved through, e.g., the use of exchange bias with an antiferromagnetically ordered material (AFM) such as PtMn, IrMn, and others.

In some embodiments, magnetic tunnel junction cell 10A is in the low resistance state where the magnetization orientation of ferromagnetic free layer 12A is parallel and in the same direction of the magnetization orientation of ferromagnetic pinned layer 14A. This is termed the low resistance state or "0" data state. In other embodiments, magnetic tunnel junction cell 10A is in the high resistance state where the magnetization orientation of ferromagnetic free layer 12A is anti-parallel and in the opposite direction of the magnetization orientation of ferromagnetic pinned layer 14A. This is termed the high resistance state or "1" data state.

Switching the resistance state and hence the data state of magnetic tunnel junction cell 10A via spin-transfer occurs when a current, passing through a magnetic layer of magnetic tunnel junction cell 10A, becomes spin polarized and imparts a spin torque on free layer 12A of magnetic tunnel junction cell 10A. When a sufficient spin torque is applied to free layer 12A, the magnetization orientation of free layer 12A can be switched between two opposite directions and accordingly, magnetic tunnel junction cell 10A can be switched between the parallel state (i.e., low resistance state or "0" data state) and anti-parallel state (i.e., high resistance state or "1" data state).

As shown in FIG. 1A and discussed above, a generic magnetic tunnel junction cell has three main parts: ferromagnetic free layer 12A, barrier layer 13A and ferromagnetic reference or pinned layer 14A. Free layer 12A is where data or bit information is stored when the device operates under "read", or overwritten when the device operates under "write". Each ferromagnetic layer 12A, 14A acts as a "spin filter" when cell 10A writes with "0" or "1" as the switching current passes through in opposite directions to alter magnetization of free layer 12A.

Figure 1B:
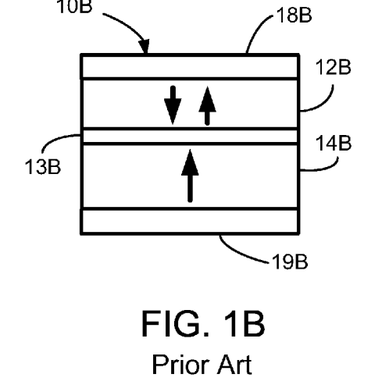
FIG. 1B is a side view cross-sectional diagram of an illustrative perpendicular anisotropy magnetic tunnel junction cell with out-of-plane magnetization orientation.

The magnetization orientations of free layer 12A and pinned layer 14A of magnetic tunnel junction cell 10A are in the plane of the layers, or in-plane. FIG. 1B illustrates an alternate embodiment of a magnetic tunnel junction cell that has the magnetization orientations of the free layer and the pinned layer perpendicular to the plane of the layers, or out-of-plane.

Similar to magnetic tunnel junction cell 10A of FIG. 1A, magnetic tunnel junction cell 10B of FIG. 1B has relatively soft ferromagnetic free layer 12B and a ferromagnetic reference (i.e., fixed or pinned) layer 14B separated by an oxide barrier layer 13B or non-magnetic tunnel barrier. Pinned layer 14B can be a single layer with large coercivity or a layer pinned by a pinning layer, or a synthetic antiferromagnetic (SAF) trilayer, or a SAF pinned by a pinning layer. A first electrode 18B is in electrical contact with ferromagnetic free layer 12B and a second electrode 19B is in electrical contact with ferromagnetic pinned layer 14B. Other layers, such as seed or capping layers, are not depicted for clarity. Electrodes 18B, 19B electrically connect ferromagnetic layers 12B, 14B to a control circuit providing read and write currents through layers 12B, 14B. The various elements of cell 10B are similar to the element of cell 10A, described above, except that the magnetization orientations of layers 12B, 14B are oriented perpendicular to the layer extension rather than in the layer plane.

Free layer 12B and pinned layer 14B each have a magnetization orientation associated therewith, illustrated in FIG. 1B, where two opposing magnetization arrows represent a readily switchable magnetization orientation. In some embodiments, magnetic tunnel junction cell 10B is in the low resistance state or "0" data state where the magnetization orientation of free layer 12B is in the same direction of the magnetization orientation of pinned layer 14B. In other embodiments, magnetic tunnel junction cell 10B is in the high resistance state or "1" data state where the magnetization orientation of free layer 12B is in the opposite direction of the magnetization orientation of pinned layer 14B.

Similar to cell 10A of FIG. 1A, switching the resistance state and hence the data state of magnetic tunnel junction cell 10B via spin-transfer occurs when a current, passing through a magnetic layer of magnetic tunnel junction cell 10B, becomes spin polarized and imparts a spin torque on free layer 12B. When a sufficient spin torque is applied to free layer 12B, the magnetization orientation of free layer 12B can be switched between two opposite directions and accordingly, magnetic tunnel junction cell 10B can be switched between the low resistance state or "0" data state and the high resistance state or "1" data state.

The previous discussion directed to cell 10A of FIG. 1A and cell 10B of FIG. 1B applies, in general, to the magnetic tunnel junction cells described below. The various elements of the tunnel junctions described below are similar to and have the same or similar properties and features as the corresponding elements of cells 10A, 10B described above, unless indicated otherwise.

Figure 2:
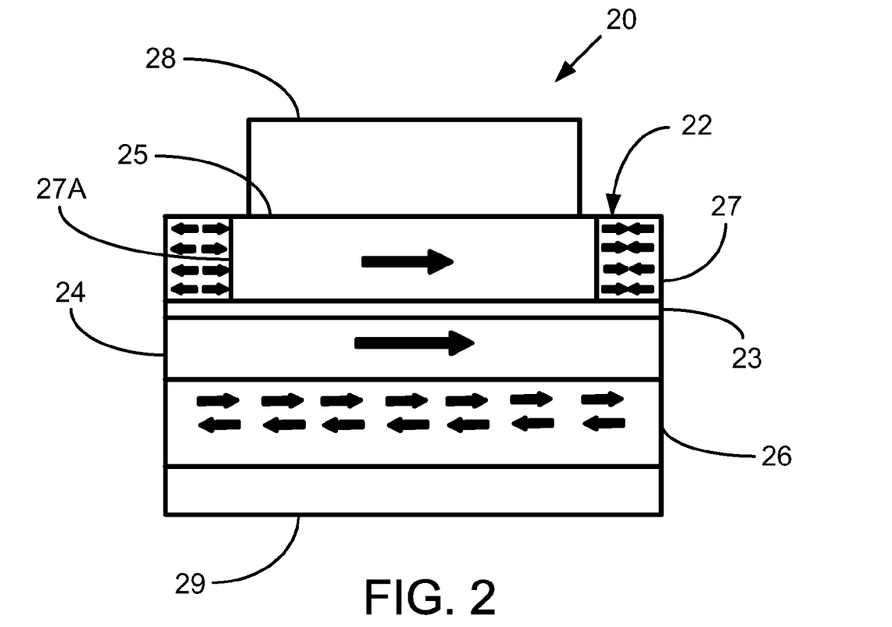
FIG. 2 is a side view cross-sectional diagram of a first embodiment of a magnetic tunnel junction cell of this disclosure.

FIG. 2 is a cross-sectional schematic diagram of a magnetic tunnel junction cell 20 that includes a soft ferromagnetic free layer 22, a ferromagnetic reference (i.e., pinned) layer 24, and an antiferromagnetic pinning layer 26. Ferromagnetic layers 22, 24 may be made of any useful ferromagnetic (FM) material, such as described above. Pinned layer 24 can be a single layer or a synthetic antiferromagnetic (SAF) trilayer. Pinning layer 26 is an antiferromagnetically ordered material such as PtMn, IrMn, and others. Ferromagnetic free layer 22 and ferromagnetic pinned layer 24, each which have a magnetization orientation associated therewith, are separated by an oxide barrier layer 23 or non-magnetic tunnel barrier. In FIG. 2, the magnetization orientations of free layer 22 and pinned layer 24 are shown as parallel, although it is well understood that these orientations could be antiparallel. The magnetization orientation of pinned layer 24 is pinned by antiferromagnetic pinning layer 26, or in other embodiments, may be a fixed layer without pinning but with a high coercivity to stabilize itself. For magnetic tunnel junction cell 20, the magnetization orientations of free layer 22 and pinned layer 24 are in the plane of the layers, or in-plane. Note that other layers, such as seed or capping layers, are not depicted for clarity. A first electrode 28 is in electrical contact with ferromagnetic free layer 22 and a second electrode 29 is in electrical contact with ferromagnetic pinned layer 24 via antiferromagnetic pinning layer 26.

In accordance with this disclosure, free layer 22 has a ferromagnetic central portion 25 and a stabilizing portion 27 positioned radially proximate to central portion 25. In this embodiment, stabilizing portion 27 is an antiferromagnetic (AFM) material; PtMn (e.g., $Pt_{10}Mn_{90}$), FeMn, IrMn, NiMn, and CrMnPt are suitable materials for antiferromagnetic stabilizing portion 27. In some embodiments, stabilizing portion 27 is an antiferromagnetic electrically conducting material, whereas in other embodiments, stabilizing portion 27 is an antiferromagnetic electrically insulating material (NiO is one suitable such material). Central portion 25 has a smaller size (e.g., diameter) than the corresponding pinned layer 24; together, central portion 25 and stabilizing portion 27 have the same or similar size as the corresponding pinned layer 24. Electrode 28 is smaller than free layer 22 and does not extend to the edges of free layer 22; in the illustrated embodiment, electrode 28 is smaller than central portion 25; this construction inhibits and preferably prevents current from flow from electrode 28 to stabilization portion 27.

Figure 2A:
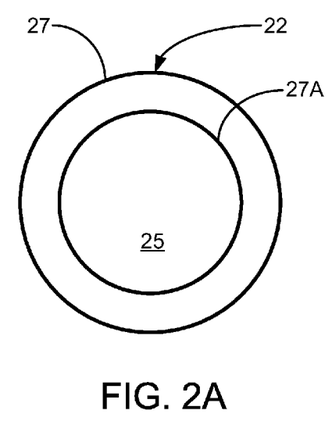
FIG. 2A is a top view of the free layer of the magnetic tunnel junction cell of FIG. 2.

As seen in FIG. 2 and in FIG. 2A, central portion 25 and stabilizing portion 27 meet at an interface 27A. In this embodiment, with stabilizing portion 27 being an antiferromagnetic material, exchange coupling occurs at interface 27A between stabilizing portion 27 and central portion 25. Returning to FIG. 2, electrode 28 is smaller than central portion 25 and does not extend to interface 27A.

Stabilizing portion 27 may have a thickness from, for example, about 0.5 nm to 5 nm, although thinner and thicker portions are suitable. The thickness of stabilizing portion 27 is a function of the material of stabilizing portion, and may be a function of any or all of the material of ferromagnetic central portion 25, the dimensions of central portion 25, and the thickness of the overall free layer 22. The thickness in the radial direction of stabilizing portion 27 is sufficiently thick to provide exchange coupling with central portion 25, yet thin enough that stabilizing portion 27 does not pin the magnetization orientation of central portion 25 in a certain direction. For example, when stabilizing portion 27 is $Pt_{10}Mn_{90}$, a thickness of about 2 to 6 nm is suitable.

Stabilizing portion 27 stabilizes the remnant state of the magnetization configuration of free layer 22 via exchange coupling, particularly, of the magnetization proximate interface 27A. Additionally, due to pinning at interface 27A, the magnetization within central portion 25 is more stable from its center to edge. This improves the thermal stability of cell 20 and, when magnetic tunnel junction cell 20 is combined with a plurality of cells in a memory array, the exchange coupling at interface 27A helps each individual free layer 22 maintain a single magnetization orientation, and thus, helps cell 20 maintain its domain state.

Stabilizing portion 27 additionally improves the ability of thermal-assisted writing. During writing, writing current passing through magnetic tunnel junction cell 20 heats up the stack to above the blocking temperature of the surrounding antiferromagnetic (AFM) material (for example, above 150° C. for $Pt_{10}Mn_{90}$). Above the blocking temperature, the amount of exchange coupling reduces, allowing central ferromagnetic portion 25 to rotate. When the magnetization orientation of central portion 25 is reversed and the write current is removed, central portion 25 and the surrounding antiferromagnetic stabilizing portion 27 are cooled down, and thus the exchange coupling between them is recovered. When cooled, the magnetization orientation of central portion 25 is stable. The resulting magnetization orientation is reverse to prior writing. As antiferromagnetic stabilizing portion 27 has no net moment, it does not contribute to either noise in read back or produce stray field to other adjacent magnetic tunnel junction cells.

Figure 3:
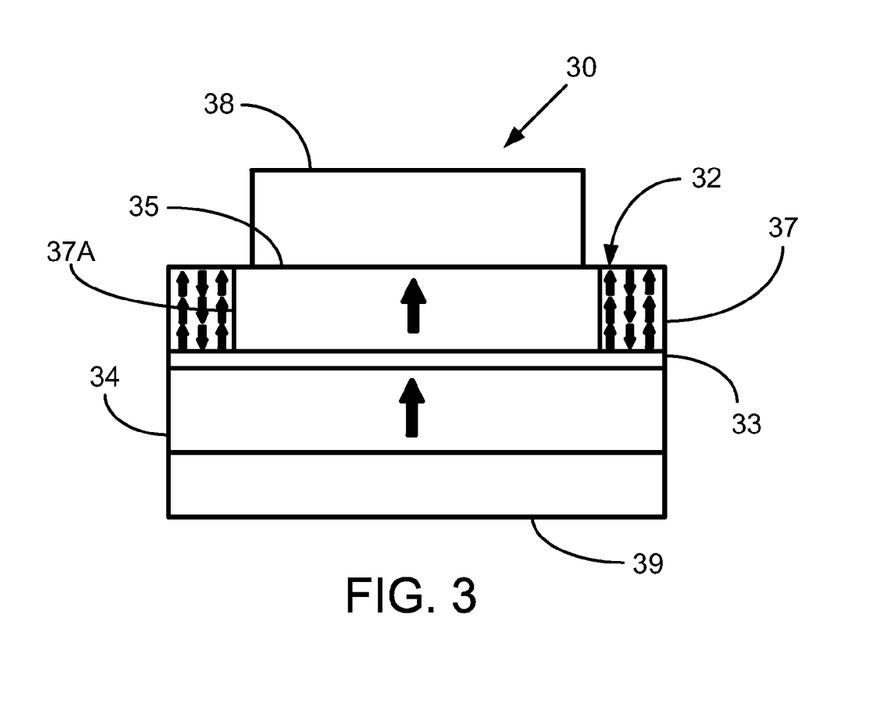
FIG. 3 is a side view cross-sectional diagram of a second embodiment of a magnetic tunnel junction cell of this disclosure.

FIG. 3 illustrates an alternate embodiment of a magnetic tunnel junction cell that has the magnetization orientations of the free layer and the pinned layer perpendicular to the plane of the layers, or out-of-plane. Similar to magnetic tunnel junction cell 20 of FIG. 2, magnetic tunnel junction cell 30 of FIG. 3 has free layer 32 and a ferromagnetic reference (i.e., pinned) layer 34 separated by an oxide barrier layer 33 or non-magnetic tunnel barrier. A first electrode 38 is in electrical contact with free layer 32 and a second electrode 39 is in electrical contact with pinned layer 34. This illustrated tunnel junction cell 30 does not include a pinning layer, however, in some embodiments a pinning layer may be present. In FIG. 3, the magnetization orientations of free layer 32 and pinned layer 34 are shown as in the same direction, although it is well understood that these orientations could be opposite.

Other layers, such as seed or capping layers, are not depicted for clarity. The various elements of cell 30 are similar to the elements of cell 20, described above, except that the magnetization orientations of layers 32, 34 are oriented perpendicular to the layer extension rather than in the layer plane.

In accordance with this disclosure, free layer 32 has a ferromagnetic central portion 35 and a stabilizing portion 37 positioned radially proximate to central portion 35. In this embodiment, stabilizing portion 37 is an antiferromagnetic material. Central portion 35 and stabilizing portion 37 meet at an interface 37A. In this embodiment, with stabilizing portion 37 being an antiferromagnetic material, exchange coupling occurs at interface 37A between stabilizing portion 37 and central portion 35.

Figure 4:
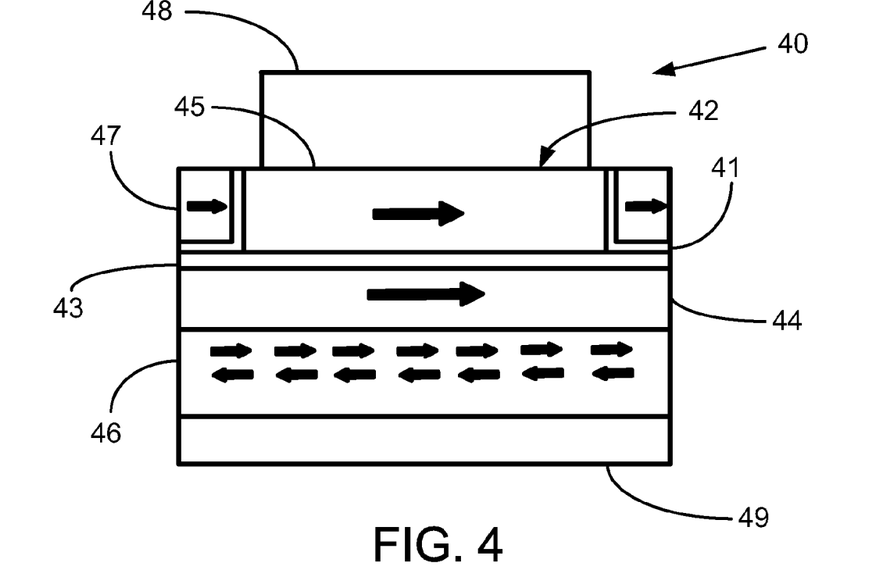
FIG. 4 is a side view cross-sectional diagram of a third embodiment of a magnetic tunnel junction cell of this disclosure.
Figure 5:
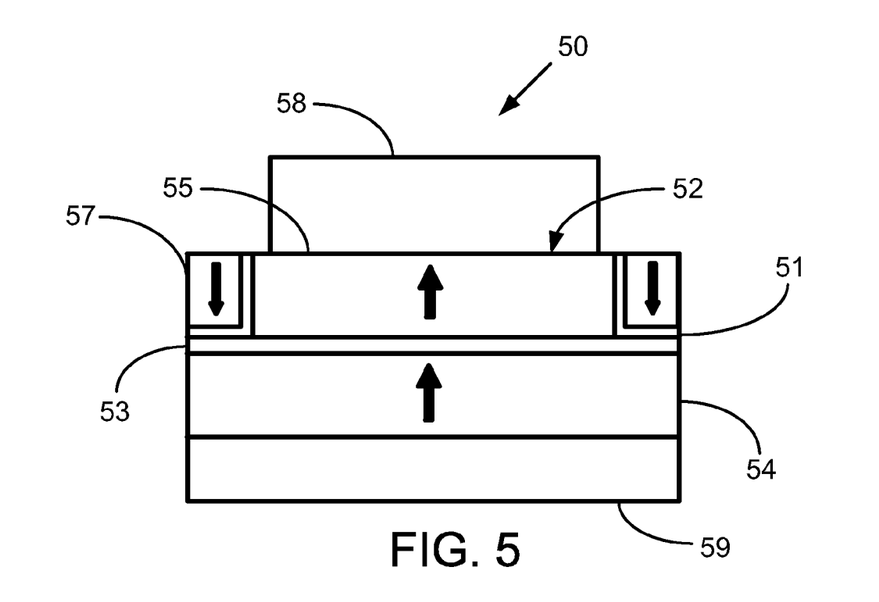
FIG. 5 is a side view cross-sectional diagram of a fourth embodiment of a magnetic tunnel junction cell of this disclosure.

FIGS. 4 and 5 provide additional embodiments of magnetic tunnel junction cells having a stabilization portion in the free layer, but in these embodiments, the stabilization portion is a ferromagnetic material. FIG. 4 provides a magnetic tunnel junction 40 wherein the magnetization orientations of the free layer and the pinned layer are in-plane, and FIG. 5 provides a magnetic tunnel junction 50 having magnetization orientations out-of-plane.

Returning to FIG. 4, magnetic tunnel junction cell 40 includes a soft ferromagnetic free layer 42, a ferromagnetic reference (i.e., pinned) layer 44, and an antiferromagnetic pinning layer 46. Free layer 42 and ferromagnetic pinned layer 44, each which have a magnetization orientation associated therewith, are separated by an oxide barrier layer 43 or non-magnetic tunnel barrier. The magnetization orientation of pinned layer 44 is pinned by antiferromagnetic pinning layer 46, or in other embodiments, may be a fixed layer without pinning but with a high coercivity to stabilize itself. Note that other layers, such as seed or capping layers, are not depicted for clarity. A first electrode 48 is in electrical contact with free layer 42 and a second electrode 49 is in electrical contact with ferromagnetic pinned layer 44 via antiferromagnetic pinning layer 46.

Figure 4A:
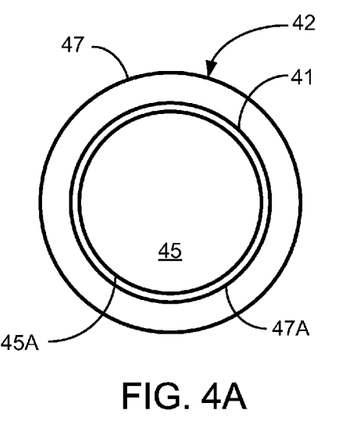
FIG. 4A is a top view of the free layer of the magnetic tunnel junction cell of FIG. 4.

Free layer 42 has a ferromagnetic central portion 45 and a stabilizing portion 47 radially proximate central portion 45; in this embodiment, stabilizing portion 47 is a ferromagnetic material. Materials suitable for stabilizing portion 47 include those suitable for central portion 45; the material of stabilizing portion 47 may be the same material or different than that of central portion 45. Central portion 45 has a smaller size (e.g., diameter) than the corresponding pinned layer 44; together, central portion 45 and stabilizing portion 47 have the same or similar size as the corresponding pinned layer 44. Separating stabilizing portion 47 from central portion 45 is a spacer 41. Spacer 41 is a non-magnetic material, in some embodiments, an electrically conductive metal or an electrically insulating material. Examples of materials suitable for spacer 41 include metals such as Cu and Ru and oxides such as $AlO_x$ (e.g., $Al_2O_3$) and $SiO_2$. Spacer 41 has a thickness sufficient to inhibit direct magnetic interaction between central portion 45 and stabilizing portion 47; suitable thicknesses for spacer 41 include those greater than 0.5 nm. As illustrated in FIG. 4A, central portion 45 and spacer 41 meeting at an interface 45A, and stabilizing portion 47 and spacer 41 meet at an interface 47A. In this embodiment, with stabilizing portion 47 being a ferromagnetic material, magnetostatic coupling occurs across spacer 41 between stabilizing portion 47 and central portion 45.

Similar to described above in reference to magnetic tunnel junction cell 20, stabilizing portion 47 stabilizes the remnant state of the magnetization configuration of free layer 42, in this embodiment though, via magnetostatic coupling across spacer 41.

Similarly in FIG. 5, magnetic tunnel junction cell 50 has free layer 52 and a ferromagnetic reference (i.e., pinned) layer 54 separated by an oxide barrier layer 53 or non-magnetic tunnel barrier. A first electrode 58 is in electrical contact with free layer 52 and a second electrode 59 is in electrical contact with pinned layer 54. This tunnel junction cell 50 does not include a pinning layer for setting the magnetization orientation of pinned layer 54. Other layers, such as seed or capping layers, are not depicted for clarity. The various elements of cell 50 are similar to the elements of cell 40, described above, except that the magnetization orientations of layers 52, 54 are oriented perpendicular to the layer extension rather than in the layer plane.

Free layer 52 has a ferromagnetic central portion 55 and a radially proximate stabilizing portion 57, which in this embodiment, is a ferromagnetic material. Materials suitable for stabilizing portion 57 include those suitable for central portion 55; the material of stabilizing portion 57 may be the same material or different than that of central portion 55. Separating stabilizing portion 57 from central portion 55 is a spacer 51. In this embodiment, with stabilizing portion 57 being a ferromagnetic material, magnetostatic coupling occurs across spacer 51 between stabilizing portion 57 and central portion 55.

Figure 6:
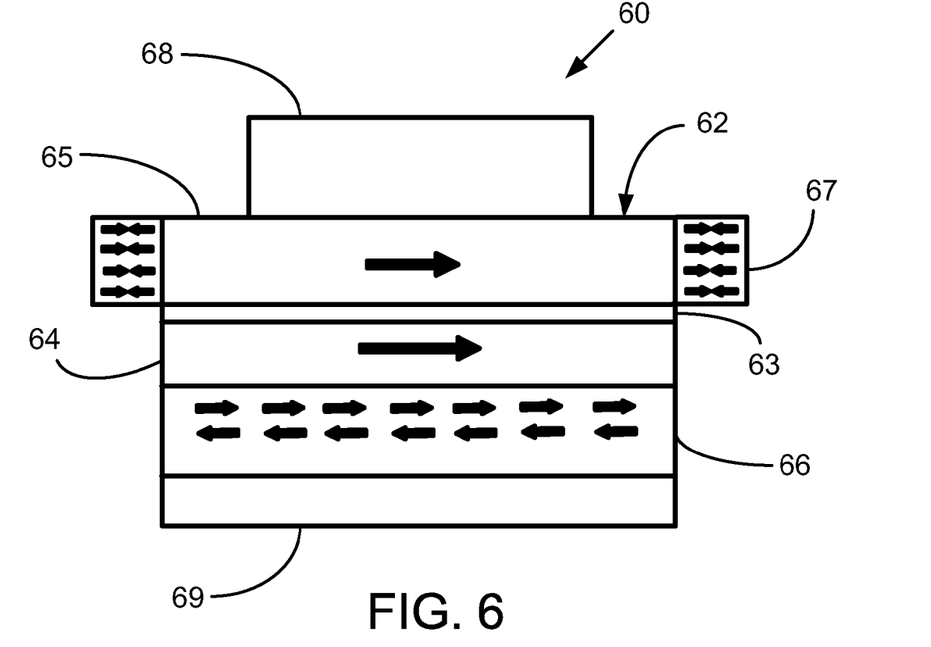
FIG. 6 is a side view cross-sectional diagram of a fifth embodiment of a magnetic tunnel junction cell of this disclosure.
Figure 7:
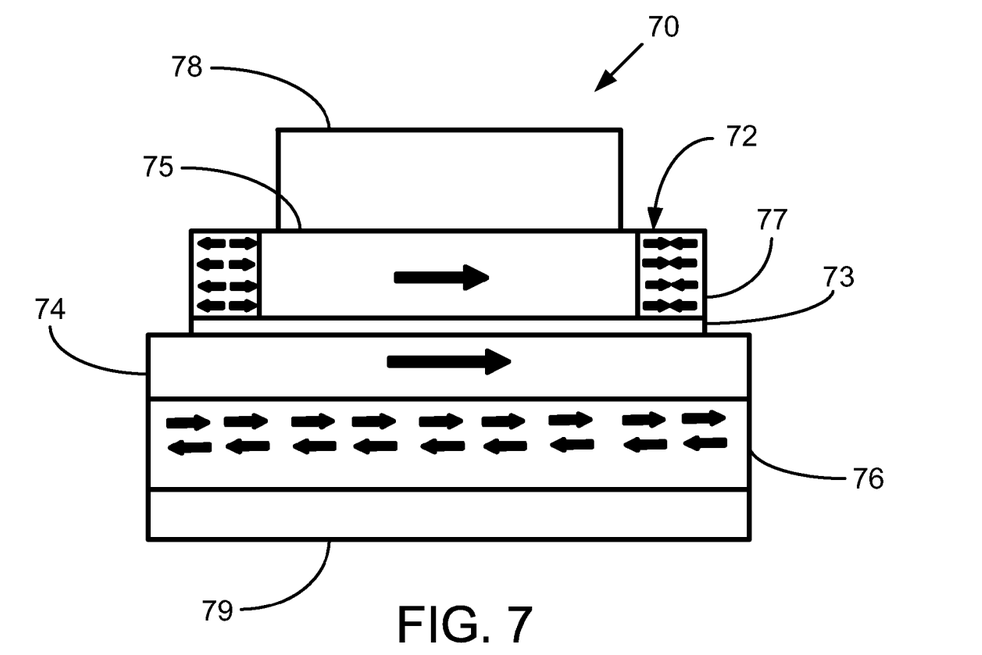
FIG. 7 is a side view cross-sectional diagram of a sixth embodiment of a magnetic tunnel junction cell of this disclosure.

Additional embodiments of magnetic tunnel junction cells having a free layer with a stabilizing portion are illustrated in FIGS. 6 and 7. FIG. 6 provides a magnetic tunnel junction 60 wherein the free layer is larger than the pinned layer, and FIG. 7 provides a magnetic tunnel junction 70 having the pinned layer larger than the free layer. Both of these cells 60, 70 are illustrated as having their magnetization orientation in-plane and with no spacer material between the ferromagnetic portion and an antiferromagnetic stabilizing portion. It is understood that the features of these cells 60, 70 could be applied to out-of-plane cells and to cells having ferromagnetic stabilizing portions and spacers.

Magnetic tunnel junction cell 60 includes a soft ferromagnetic free layer 62, a ferromagnetic reference (i.e., pinned) layer 64, and an antiferromagnetic pinning layer 66. Free layer 62 and ferromagnetic pinned layer 64 are separated by an oxide barrier layer 63 or non-magnetic tunnel barrier. The magnetization orientation of pinned layer 64 is pinned by antiferromagnetic pinning layer 66. A first electrode 68 is in electrical contact with free layer 62 and a second electrode 69 is in electrical contact with ferromagnetic pinned layer 64 via pinning layer 66. Free layer 62 has a ferromagnetic central portion 65 and a radially proximate stabilizing portion 67.

Free layer 62 is larger than pinned layer 64, so that a portion of free layer 62 overhangs pinned layer 64. In the illustrated embodiment, central portion 65 of free layer 62 approximately the same size as pinned layer 64, although in other embodiments, central portion 65 may be larger or smaller than pinned layer 64. Stabilizing portion 67 overhangs pinned layer 64 and other layers of cell 60.

Magnetic tunnel junction cell 70 of FIG. 7 includes a soft ferromagnetic free layer 72, a ferromagnetic reference (i.e., pinned) layer 74, and an antiferromagnetic pinning layer 76. Free layer 72 and ferromagnetic pinned layer 74 are separated by an oxide barrier layer 73 or non-magnetic tunnel barrier. The magnetization orientation of pinned layer 74 is pinned by antiferromagnetic pinning layer 76. A first electrode 78 is in electrical contact with free layer 72 and a second electrode 79 is in electrical contact with pinned layer 74 via pinning layer 76. Free layer 72 has a ferromagnetic central portion 75 and a radially proximate stabilizing portion 77.

Pinned layer 74 is larger than free layer 72, so that a portion of pinned layer 74 extends past free layer 72. In the illustrated embodiment, pinning layer 76 also extends past free layer 72, but barrier layer 73 is present only between free layer 72 and pinned layer 74.

Various embodiments of magnetic tunnel junction cells having a free layer with a ferromagnetic portion and a stabilizing portion have been described above. It is understood that numerous alternatives can be made to the illustrated cells. For example, although FIGS. 2A and 4A illustrate free layer 22, 42 as circular, these and their respective cells 20, 40 may have other shapes, such as elliptical, oval, etc. Depending on the shape of the free layer, the thickness of the stabilizing portion may vary around the central ferromagnetic portion. As another example, only one layer (e.g., free layer 22, 32, 42, etc.) has been illustrated in the previous embodiments as having a stabilizing portion. In other embodiments, a stabilizing portion could be included in another layer, for example, a pinned layer or pinning layer, in addition to the free layer.

Referring to FIGS. 8A through 8G, a process for manufacturing a magnetic tunnel junction cell having a free layer with a ferromagnetic portion and a stabilizing portion is illustrated. The resulting particular magnetic tunnel junction cell is similar to cell 40 of FIG. 4, having a ferromagnetic stabilizing portion separated from the central ferromagnetic portion by a spacer.

Figure 8A:
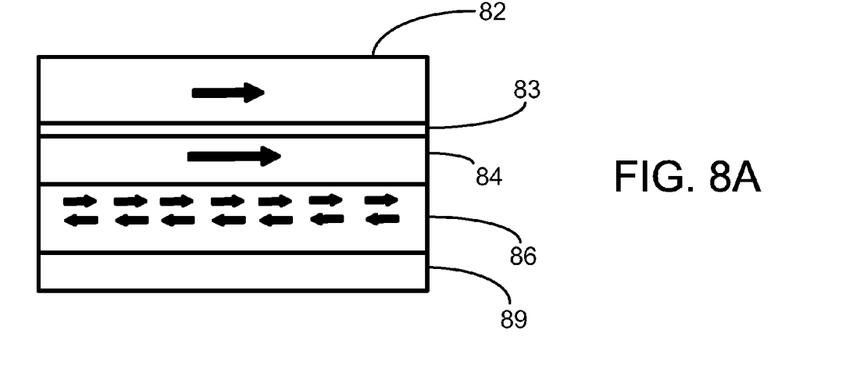
FIGS. 8A though 8G step-wise illustrate a method for making a magnetic tunnel junction cell of this disclosure.

In FIG. 8A, a base stack that includes the various layers (i.e., bottom electrode 89, pinning layer 86, pinned layer 84, barrier layer 83 and free layer 82) is formed by well-known thin film techniques such as chemical vapor deposition (CVD), physical vapor deposition (PVD), or atomic layer deposition (ALD). At this stage, free layer 82 has a size similar to the other layers; that is, at this step, free layer 82 is a precursor to the eventual central ferromagnetic portion, as free layer 82 does not have a reduced size.

Figure 8B:
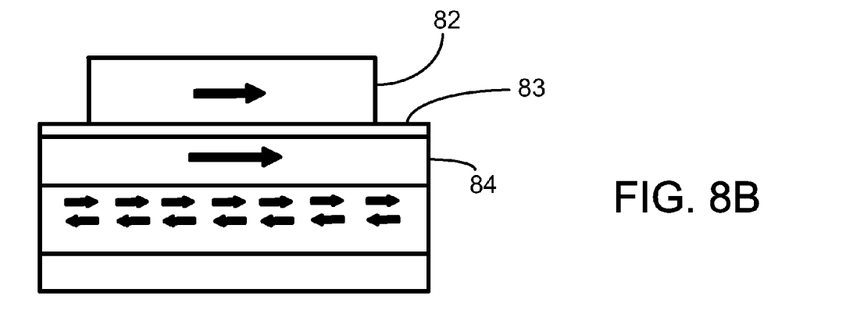

In FIG. 8B, free layer 82 is patterned (e.g., a portion of free layer 82 is removed) so that free layer 82 has a smaller size than the corresponding pinned layer 84. Barrier layer 83 is an etch-stop, so that barrier layer 83 and pinned layer 84 are not etched.

Figure 8C:
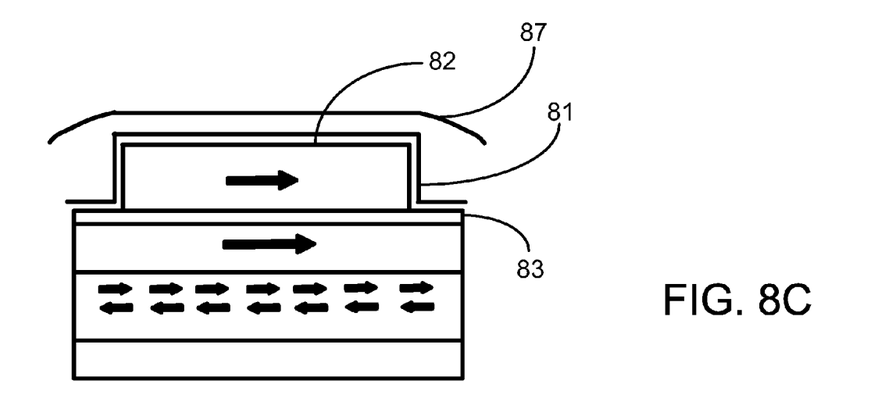

Over the patterned free layer 82, in FIG. 8C, is deposited a thin spacer layer 81, for example, by atomic layer deposition (ALD), that follows the contours of free layer 82 and barrier 83. Over spacer layer 81 is then deposited the stabilization material 87, in this embodiment, ferromagnetic material. If stabilization material 87 is an antiferromagnetic material, no spacer layer would be needed.

Figure 8D:
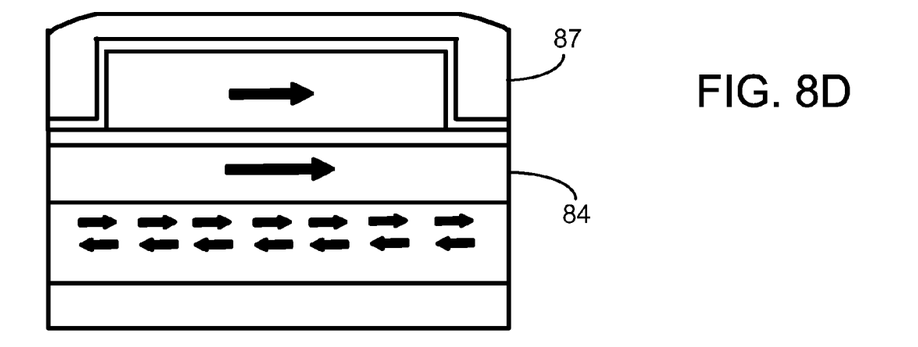
Figure 8E:
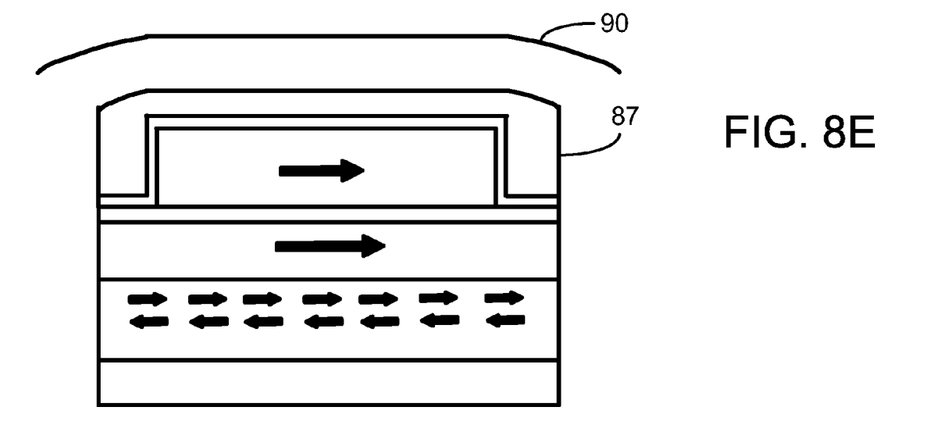
Figure 8F:
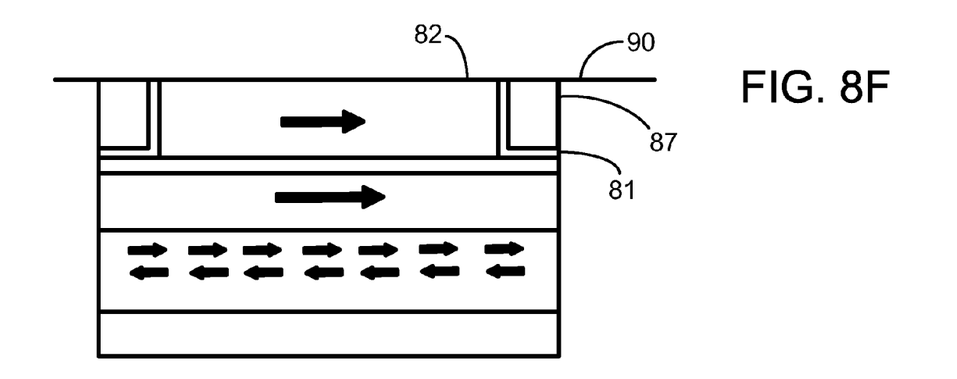

In FIG. 8D, stabilization material 87 is patterned to form a ring having a size (e.g., diameter) the same as pinned layer 84. Over this patterned stabilization material 87 is deposited a dielectric material 90 in FIG. 8E to cap the stack of layers and isolate the resulting magnetic tunnel junction cell from adjacent cells. In FIG. 8F, the surface is polished, for example by chemical mechanical polishing (CMP), to level dielectric 90, stabilization material 87 and spacer 81 with free layer 82.

Figure 8G:
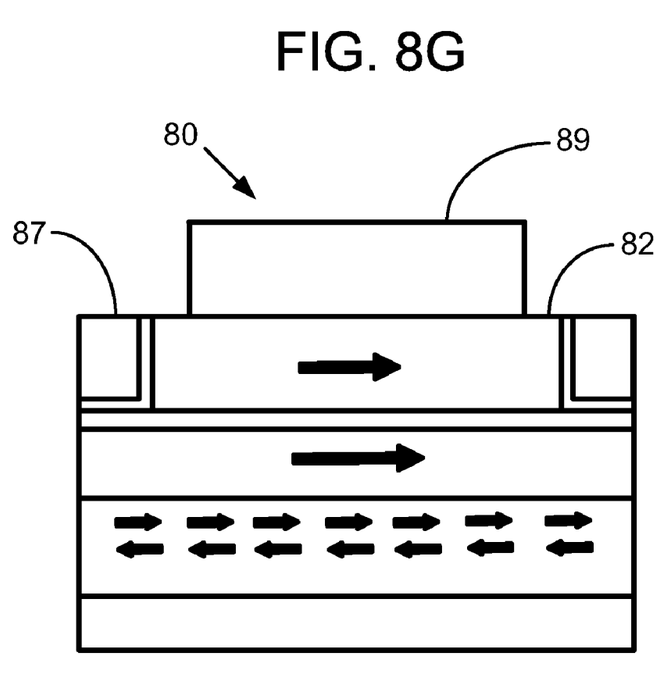

A top electrode 89 is deposited, FIG. 8G over free layer 82. Top electrode 89 is narrower than free layer 82 to inhibit (preferably prevent) current from flowing from electrode 89 to stabilization material 87. This resulting magnetic tunnel junction cell 80 is similar to magnetic tunnel junction cell 40.

Figure 9:
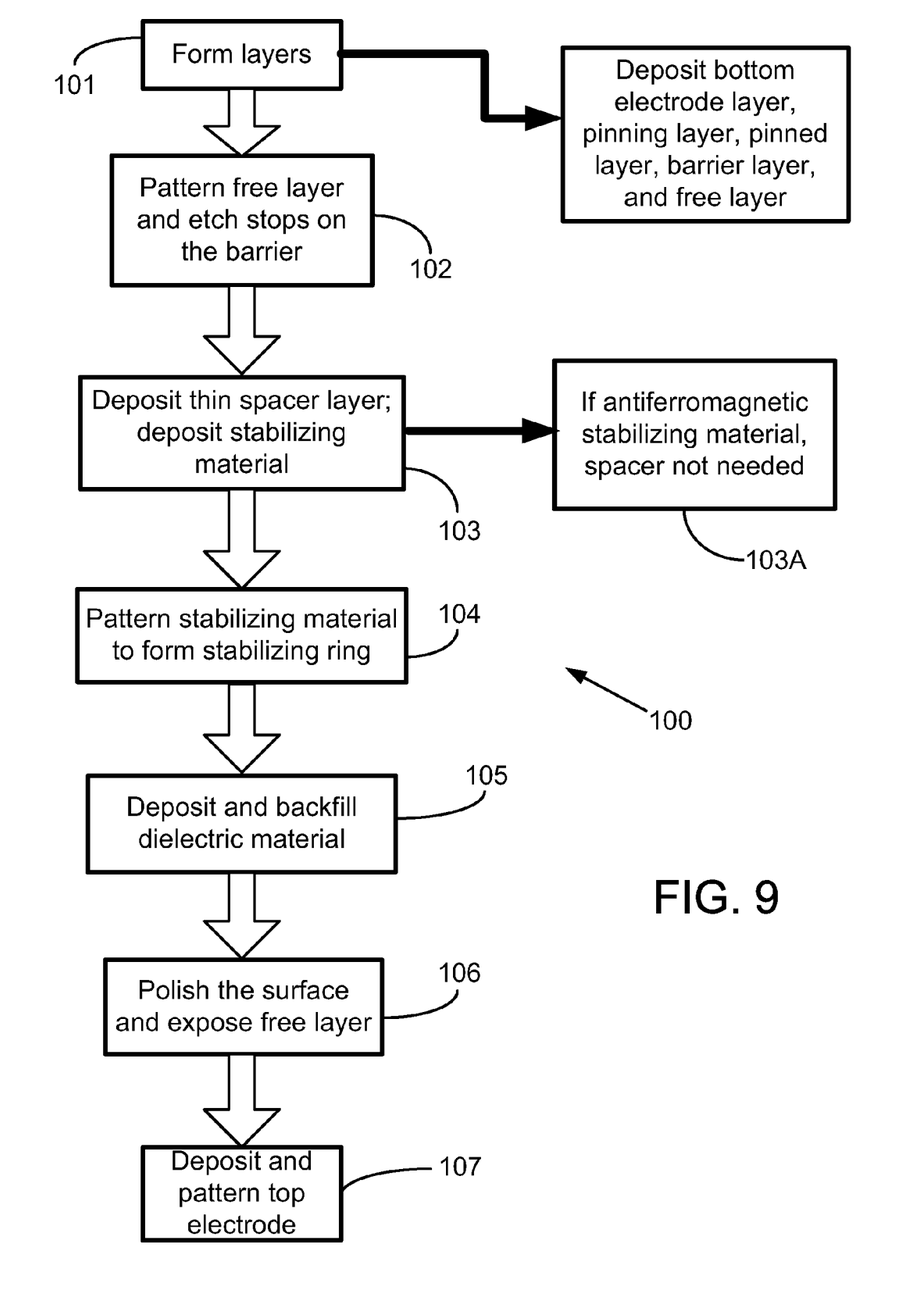
FIG. 9 is a flow chart of a method for making a magnetic tunnel junction cell of this disclosure.

FIG. 9 is a flow diagram of another method to manufacture a magnetic tunnel junction cell having a free layer with a ferromagnetic portion and a stabilizing portion. Method 100 of FIG. 9 has an initial Step 101 of forming the layers of the stack, the layers being the bottom electrode, the pinning layer, the pinned layer, barrier layer and a ferromagnetic free layer precursor. After being formed, the free layer precursor is patterned in Step 102 to provide the free layer; the barrier layer acts as an etch stop. Over the patterned free layer is deposited a spacer layer, in Step 103. If the stabilizing material is an antiferromagnetic material, as in Step 103A, then the spacer layer is not necessary. The stabilizing material is deposited over the spacer layer. If the stabilizing material is an antiferromagnetic material, the spacer layer is not required. In Step 104, the stabilizing material is patterned to form a stabilizing ring around the free layer. The stack is covered (e.g., backfilled) with deposited dielectric material in Step 105. The surface of the dielectric material, stabilizing material and spacer layer are polished in Step 106 to expose the free layer. The top electrode is deposited and patterned in the final Step 107.

It is understood that the various other magnetic tunnel junction cells (e.g., cells, 20, 30, 50, 60, 70) could be made by methods similar to those of FIGS. 8A through 8G and FIG. 9.

The magnetic tunnel junction cells of this disclosure may be used to construct a memory device that includes multiple magnetic tunnel junction cells connected together via word lines and bit lines, where a data bit is stored in the magnetic tunnel junction by changing the relative magnetization state of the ferromagnetic free layer with respect to the pinned layer. The stored data bit can be read out by measuring the resistance of the magnetic tunnel junction cell, which changes with the magnetization direction of the free layer relative to the pinned layer.

Thus, embodiments of the MAGNETIC MEMORY CELL CONSTRUCTION are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A method of forming a magnetic tunnel junction cell, the method comprising:
 providing a base stack, the base stack comprising a bottom electrode, a ferromagnetic pinned layer, a barrier layer, and a ferromagnetic free precursor layer, wherein the bottom electrode is positioned proximate the ferromagnetic pinned layer, the barrier layer is positioned proximate the ferromagnetic pinned layer and the ferromagnetic free precursor layer is positioned on the barrier layer;
 forming a free layer from the ferromagnetic free precursor layer;
 depositing stabilization material on the free layer;
 patterning the stabilization material to form a stabilizing ring radially proximate to the free layer;
 exposing at least a portion of the free layer by removing at least a portion of the stabilization material; and
 providing a top electrode over the exposed free layer.

2. The method according to claim 1, wherein the base stack is provided by forming the layers via chemical vapor deposition (CVD), physical vapor deposition (PVD), or atomic layer deposition (ALD).

3. The method according to claim 1, wherein the base stack further comprises an etch stop layer positioned between the ferromagnetic free precursor layer and the barrier layer, and wherein the step of forming the free layer processes the ferromagnetic free precursor layer, but not the barrier layer.

4. The method according to claim 1, wherein the stabilization material is an antiferromagnetic material.

5. The method according to claim 1, wherein the stabilization material is a ferromagnetic material.

6. The method according to claim 5 further comprising depositing a spacer layer after the free layer is formed and before the stabilization material is deposited.

7. The method according to claim 1, wherein the step of exposing at least a portion of the free layer is accomplished by chemical mechanical polishing.

8. The method according to claim 7 further comprising depositing a dielectric material on the patterned stabilization material before a portion of the free layer is exposed.

9. The method according to claim 8, wherein the step of chemical mechanical polishing removes at least a portion of the dielectric material, the stabilization material, and the free layer.

10. A method of forming a magnetic tunnel junction cell, the method comprising:
 providing a stack, the stack comprising a bottom electrode, a pinned layer, a barrier layer and a ferromagnetic free precursor layer, wherein the bottom electrode is positioned proximate the pinned layer, the barrier layer is positioned proximate the pinned layer and the ferromagnetic free precursor layer is positioned on the barrier layer'
 forming a free layer from the ferromagnetic free precursor layer;
 forming a stabilizing layer by depositing stabilization material on the free layer and patterning the stabilization material to form a stabilizing ring radially proximate to the free layer; and
 providing a top electrode over at least a portion of the free layer.

11. A method of forming a magnetic tunnel junction cell, the method comprising:
 providing a stack, the stack comprising a bottom electrode, a pinned layer, a barrier layer and a ferromagnetic free precursor layer, wherein the bottom electrode is positioned proximate the pinned layer, the barrier layer is positioned proximate the pinned layer and the ferromagnetic free precursor layer is positioned on the barrier layer'
 forming a free layer from the ferromagnetic free precursor layer;
 forming a stabilizing layer by depositing stabilization material on the free layer and patterning the stabilization material to form a stabilizing ring radially proximate to the free layer;
 exposing at least a portion of the free layer by chemical mechanical polishing; and
 providing a top electrode over at least a portion of the exposed free layer.

12. The method according to claim 11 further comprising depositing a dielectric material on the patterned stabilization material before a portion of the free layer is exposed.

13. The method according to claim 12, wherein the step of chemical mechanical polishing removes at least a portion of the dielectric material, the stabilization material, and the free layer.

14. A method of forming a magnetic tunnel junction cell, the method comprising:
 providing a base stack, the base stack comprising a bottom electrode, a ferromagnetic pinned layer, a barrier layer, an etch stop layer, and a ferromagnetic free precursor layer, wherein the bottom electrode is positioned proximate the ferromagnetic pinned layer, the barrier layer is positioned proximate the ferromagnetic pinned layer, the etch stop layer is positioned proximate the barrier layer, and the ferromagnetic free precursor layer is positioned on the etch stop layer;
 forming a free layer from the ferromagnetic free precursor layer;
 depositing stabilization material on the free layer;
 patterning the stabilization material to form a stabilizing ring radially proximate to the free layer;
 depositing a dielectric material on the patterned stabilization material;
 exposing at least a portion of the free layer by removing at least a portion of the stabilization material, and the dielectric material; and
 providing a top electrode over the exposed free layer.

* * * * *